United States Patent
Naito et al.

(10) Patent No.: US 8,710,715 B2
(45) Date of Patent: Apr. 29, 2014

(54) MESA-SHAPED PIEZOELECTRIC RESONATOR ELEMENT

(75) Inventors: Matsutaro Naito, Kamiina-gun (JP); Yoshiyuki Aoshima, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 1067 days.

(21) Appl. No.: 11/527,579

(22) Filed: Sep. 27, 2006

(65) Prior Publication Data
US 2007/0096596 A1    May 3, 2007

(30) Foreign Application Priority Data

Oct. 31, 2005    (JP) .................................. 2005-315733

(51) Int. Cl.
H03H 9/02    (2006.01)

(52) U.S. Cl.
CPC ................................ H03H 9/02157 (2013.01)
USPC .......................................... 310/320; 310/367

(58) Field of Classification Search
CPC .......................... H03H 9/02157; H03H 9/177
USPC .......................... 310/320, 348, 324, 361, 367
See application file for complete search history.

(56) References Cited

U.S. PATENT DOCUMENTS

2004/0095044 A1* 5/2004 Yagishita ...................... 310/348

FOREIGN PATENT DOCUMENTS

| JP | U 06-052230 | 7/1994 |
| JP | A 2001-230655 | 8/2001 |
| JP | A-2003-133890 | 5/2003 |
| JP | A 2005-094410 | 4/2005 |
| JP | A 2005-268830 | 9/2005 |

OTHER PUBLICATIONS

Goka et al.; "Decoupling Effect of Multi-Stepped Bi-Mesa AT-Cut Quartz Resonators"; Proceedings of the 2003 IEEE International Frequency Control Symposium and PDA Exhibition; 2003.*
Goka et al.; "Decoupling Effect of Multi-Stepped Bi-Mesa At-Cut Quartz Resonators"; Proceedings of the $24^{th}$ USE; pp. 41-42; Toyo Communication on Euipment Co., Ltd.; Nov. 2003. (with trans.).
Goka et al; "Decoupling Effect of Multi-Stepped Bi-Mesa At-Cut Quartz Resonators"; Technical Report of the $150^{th}$ Committee in Japan Society for the Promotion Science; No. 86; Toyocom; Jan. 2004. (with trans.).
Goka et al; "Mode Decoupling Effect of Multistepped Bi-Mesa AT-Cut Quartz Resonators" *Japanese Journal of Applied Physics*; vol. 43; No. 5B; pp. 3016-3019; 2004.
Goka et al; "Spurious Characteristics of 2-stepped Bi-mesa AT-cut Quartz Resonators"; USE99 The $20^{th}$Symposium on Ultrasonic Electronics; pp. 67-68; Nov. 1999. (with trans.).

* cited by examiner

*Primary Examiner* — Derek Rosenau
(74) *Attorney, Agent, or Firm* — Oliff PLC

(57) ABSTRACT

A mesa-shaped piezoelectric resonator element including a resonator section having a thicker thickness than a peripheral section on the board surface of a piezoelectric substrate formed in a rectangular shape, wherein, when the length of the long side of the piezoelectric substrate is x and the board thickness of the resonator section is t, etching depth y of a level-difference section is set to fulfill a relationship in the following equation, based on the board thickness t.

$$y = -1.32 \times \left(\frac{x}{t}\right) + 43 \pm 5 \quad (\%)$$

12 Claims, 4 Drawing Sheets

MESA-SHAPED PIEZOELECTRIC RESONATOR ELEMENT

BACKGROUND OF THE INVENTION

1. Technical Field

The present invention relates to a piezoelectric resonator element. In particular, the present invention relates to a mesa-shaped piezoelectric resonator element in which the thickness of a resonator section is thicker than that of a peripheral section.

2. Related Art

A traditionally manufactured AT cut quartz crystal resonator element forms an excitation electrode in the center of a piezoelectric substrate using a characteristic in which vibrational energy is concentrated in an area having a large mass. According to such a configuration, excitation in a desired vibration mode may be ensured without affecting vibration characteristics, even when a structure supporting a peripheral section of the piezoelectric substrate is employed. However, as the need for miniaturization of resonators and oscillators in which the piezoelectric resonator element is mounted increases, miniaturization of the piezoelectric resonator element serving as the core of the resonators and oscillators is demanded. When the area of the piezoelectric substrate decreases, the difference in mass within the substrate also decreases. Therefore, it is difficult to concentrate the vibrational energy in the resonator section. As a result, piezoelectric resonator elements having a mesa shape, a bevel shape, a convex shape, and the like have been developed. In the piezoelectric resonator elements, a resonator section having a thicker board thickness than the peripheral section is formed on the board surface of the piezoelectric substrate to confine the vibrational energy within the resonator section. For example, the piezoelectric resonator element is that described in JP-UM-A-6-52230.

JP-UM-A-6-52230 is an example of related art.

The mesa-shaped piezoelectric resonator element does not have a tapered structure or a curved structure, as do the bevel-shaped or convex-shaped piezoelectric resonator element, but rather has a simple step structure. Therefore, the mesa-shaped piezoelectric resonator element can be processed by etching and is suitable for mass production. However, in the mesa-shaped piezoelectric resonator element, the boundary between the resonator section and the peripheral section is clearly separated by a level difference. As a result, depending on the position of the level difference, an unnecessary mode is coupled with a thickness sliding mode that is a main mode. The unnecessary mode is, for example, a flexural mode. Therefore, the vibration characteristics may deteriorate. In addition, in the mesa-shaped piezoelectric resonator element, it is known that the crystal impedance (CI) value tends to decrease when the level difference between the resonator section and the peripheral section is increased. However, when etching depth is too deep, unnecessary vibrations may easily occur in the resonator section. The etching depth is the depth of the etching performed to form the level difference. In addition, when the etching time is increased to increase the etching depth, undesired etching may occur with degradation of the protective film. In other words, a phenomenon may occur in which areas that should not be etched are etched. In addition, as a result of the effect of the undesired etching, variations may occur in the shape of the manufactured piezoelectric resonator element.

SUMMARY

An advantage of the present invention is to provide a mesa-shaped piezoelectric resonator element in which a mesa etching depth that is appropriate for the size of the piezoelectric substrate is selected.

The mesa-shaped piezoelectric resonator element according to one aspect of the invention includes a resonator section having a greater thickness than a peripheral section on the board surface of a rectangular piezoelectric substrate. When the length of the long side of the piezoelectric substrate is x and the board thickness of the resonator section is t, the etching depth y of the level-difference section is set so as to fulfill the following relationship, based on the board thickness t.

$$y = -1.32 \times \left(\frac{x}{t}\right) + 43 \pm 5 \quad (\%)$$

According to such a configuration, the percentage of the etching depth may be set to a minimum value at which the characteristic change of the CI value is flat. As a result, the etching time may be the minimum required time and variations in the shape of the piezoelectric resonator element caused by undesired etching may be reduced. In addition, the etching depth can be kept shallow and coupling with unnecessary vibrations is low. Therefore, the CI value can be reduced without causing deterioration of the vibration characteristics. In other words, a piezoelectric resonator element having a high design margin may be provided.

In addition, in the mesa-shaped piezoelectric resonator element having such a configuration, the fineness ratio x/t is preferably 30 or below. When the fineness ratio is higher than 30, the value of the calculated etching depth becomes significantly small. Therefore, the effect achieved by forming the resonator section is not proportional to the time and number of procedures required to form the resonator section. As a result, an effect that is proportional to the required time and number of procedures may be achieved by setting the etching depth by determining y to the piezoelectric substrate having the fineness ratio x/t that is 30 or below and forming the resonator section.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described in detail with reference to the drawings. The embodiments described hereafter are only some of the embodiments of the invention.

Figure 1A:
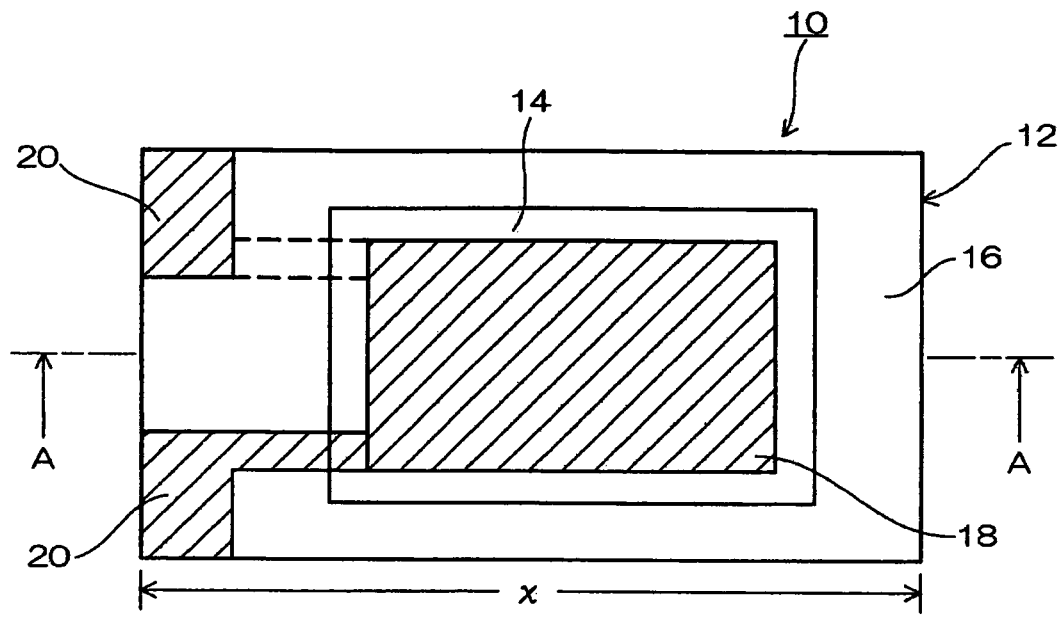
FIG. 1A and FIG. 1B are diagrams showing the shape of the mesa-shaped piezoelectric resonator element according to an embodiment of the invention.
Figure 1B:
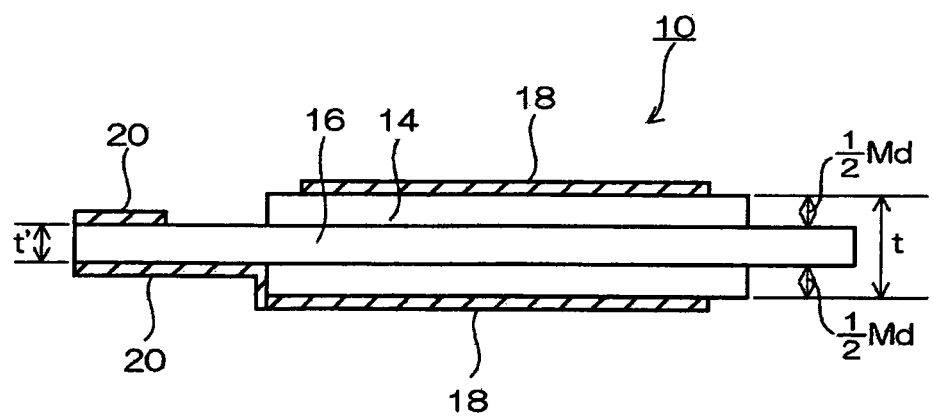
Figure 2:
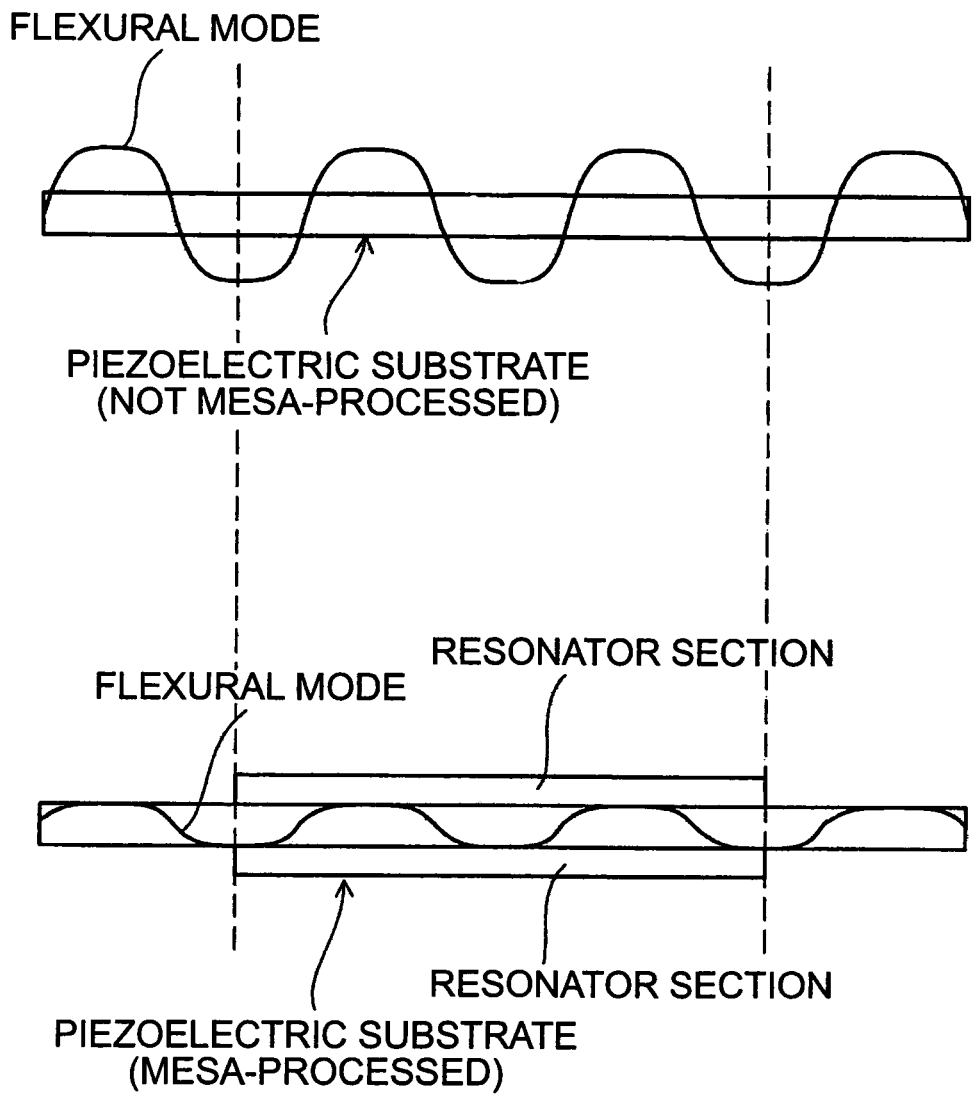
FIG. 2 is a graph showing a flexural mode suppressing effect by the formation of the resonator section.

FIG. 1A and FIG. 1B are diagrams showing the shape of a mesa-shaped piezoelectric resonator element 10, according to an embodiment of the invention. FIG. 1A is a diagram showing the planar shape of the piezoelectric resonator element. FIG. 1B is a diagram showing a cross-section taken along line A-A of FIG. 1A. The piezoelectric resonator element 10 according to the embodiment has a mesa shape in which a resonator section 14 having a thicker board thickness than a peripheral section 16 is formed on the board surface of a rectangular piezoelectric substrate 12. Specifically, each side section of the resonator section 14 is formed to be parallel to each side section of the piezoelectric substrate 12. Etching depth Md is the difference between the board thickness t of the resonator section 14 and the board thickness t' of the peripheral section. The etching depth Md is equal to or shallower than 30% of the board thickness. The resonator section 14 is formed so that a level-difference section to be the boundary between the resonator section 14 and the peripheral section 16 is positioned on the loop of an unnecessary mode (curved mode and the like) occurring in the piezoelectric substrate 12. As a result of such a configuration, the unnecessary mode can be suppressed and the vibration characteristics can be kept favorable (see FIG. 2). In the resonator section 14 of the piezoelectric substrate 12 having such a shape, an excitation electrode 18 is formed. An extraction electrode 20 is formed from the excitation electrode 18 to the support section of the peripheral section 16.

Figure 3:
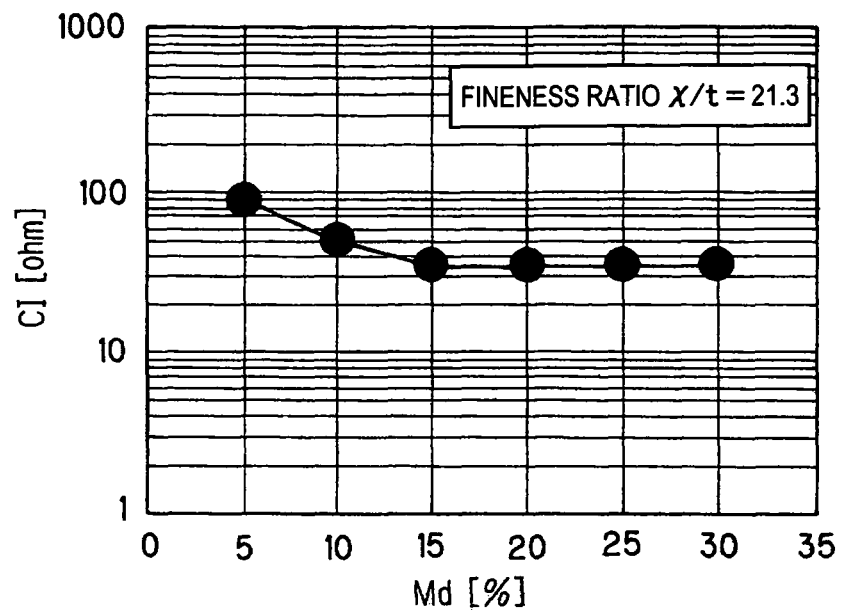
FIG. 3 is a graph showing a relationship between the etching depth and the CI value in a mesa-shaped piezoelectric resonator element having a certain fineness ratio.

The inventors of the invention have performed various experiments and simulations on the piezoelectric resonator element 10 having such a configuration, with regards to a relationship between the CI value and the etching depth Md of the piezoelectric substrate 12 when the resonator section 14 is formed. A tendency such as that shown in FIG. 3 has been discovered. According to the tendency shown in FIG. 3, the CI value of the piezoelectric resonator element 10 tends to decrease when the etching depth Md is increased. However, when the etching depth Md reaches a certain value (15% in FIG. 3), the characteristic change of the CI value become almost flat when the etching depth Md is subsequently increased. The relationship between the etching depth Md and the CI value shown in FIG. 3 is related to a piezoelectric resonator element having a fineness ratio x/t of 21.3 to the long side x of the piezoelectric substrate. The fineness ratio x/t is the ratio indicating the length of the long side x to the board thickness t.

Figure 4:
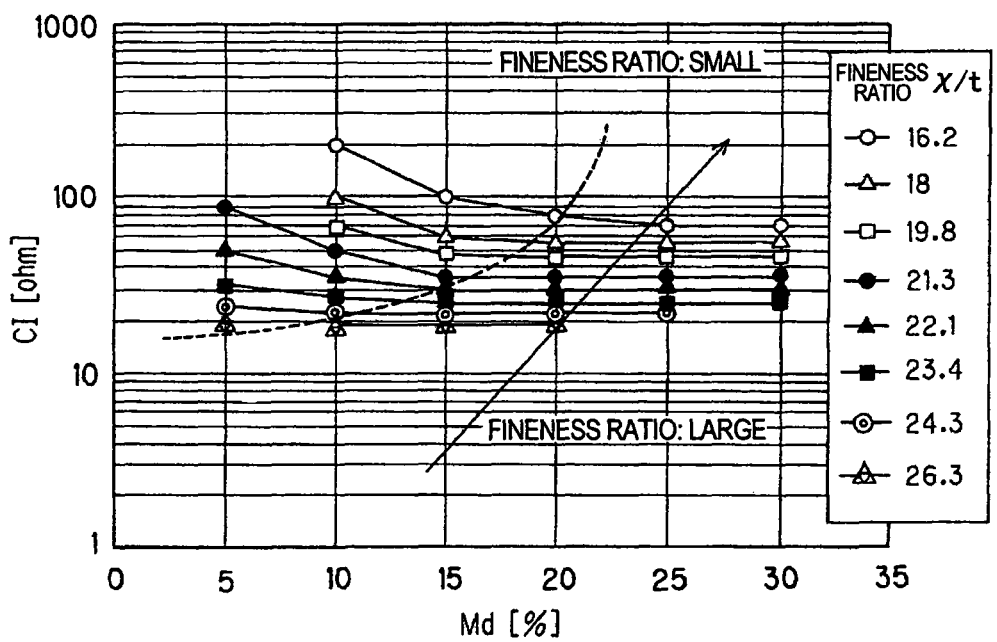
FIG. 4 is a graph showing a relationship between the etching depth and the CI value in a mesa-shaped piezoelectric resonator element having a plurality of fineness ratios.

In researching such a tendency, the inventors and the like of the invention have also discovered a tendency such as that shown in FIG. 4, in the relationship between the etching depth Md and the CI value. FIG. 4 is a diagram showing the relationship between the etching depth Md and the CI value when the etching depth is changed to various depths in piezoelectric resonator elements having fineness ratios x/t that vary between 16.2 and 26.3. As can be understood from FIG. 4, the fineness ratio x/t affects the relationship between Md and the CI value. It is understood that the smaller the fineness ratio x/t is, the larger the value of Md at which the characteristic change of the CI value becomes flat is.

When forming the so-called mesa-shaped piezoelectric resonator element 10, such as that shown in FIG. 1, the shape is generally arranged using a method in which the area to become the resonator section 14 is covered with a protective film and chemical-etching is performed on the area to become the peripheral section 16. Here, when the peripheral section 16 is etched to form the resonator section 14, the protective film applied to the areas other than the etching area deteriorates and undesired etching occurs, when the etching time for obtaining the etching depth Md is long. The undesired etching tends to differ individually depending on the state of the protective film and the state of the substrate. Therefore, the variation in the shape of the substrate may increase due to the effect of the undesired etching. Furthermore, the coupling of the unnecessary mode with a main mode has a tendency that is opposite of the decrease in the CI value associated with the increase in the etching depth Md. Therefore, when the etching depth Md is increased, the unnecessary mode is more easily coupled with a thickness-sliding mode that is the main mode. The unnecessary mode is, for example, a flexural mode. Therefore, degradation of the vibration characteristics may occur. As a result, if the minimum value at which the characteristic change of the CI value becomes flat can be selected as the etching depth Md, the possibility of unnecessary etching and the degradation of the vibration characteristics may be decreased and favorable vibration characteristics may be obtained.

Figure 5:
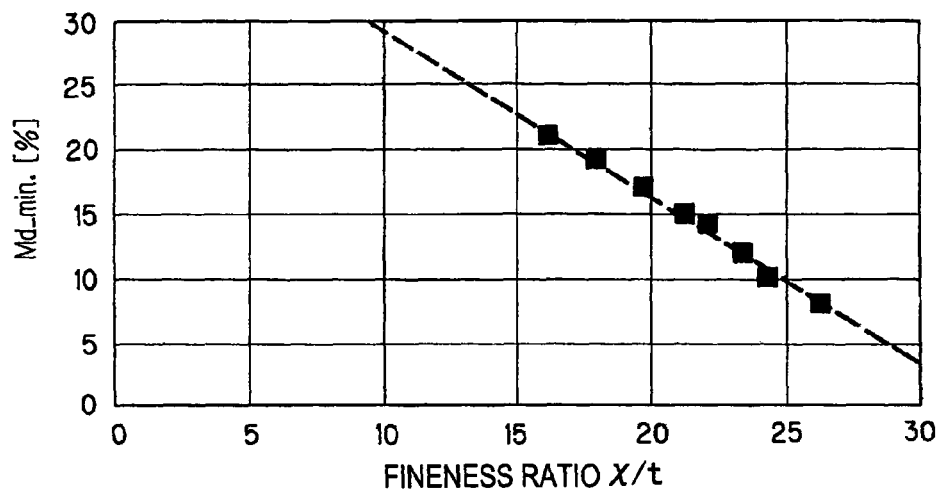
FIG. 5 is a graph showing the minimum value of etching depth at which the characteristic change of the CI value becomes flat in the mesa-shaped piezoelectric resonator elements having differing fineness ratios.

The inventors and the like have conducted intensive research and have discovered a relationship shown in FIG. 5. FIG. 5 is a graph showing the fineness ratio x/t and a minimum value Md_min at which the characteristic change of the CI value becomes flat, when the changes in the CI value are studied by changing the etching depth Md for each fineness ratio x/t. As can be understood from FIG. 5, the relationship between the fineness ratio x/t and the minimum value Md_min at which the characteristic change of the CI value becomes flat is almost a proportional relationship. When the minimum value Md_min of the etching depth in the equation is indicated by y, the minimum value y of the etching depth can be expressed as follows, based on the board thickness t.

$$y = -1.32 \times \left(\frac{x}{t}\right) + 43 \pm 5 \quad (\%) \qquad \text{Equation 1}$$

In other words, a thickness that is y % of the board thickness t is the minimum value of the etching depth Md. Therefore, the mesa-shaped piezoelectric resonator element 10 according to the embodiment fulfills the relationship in Equation 1, as a percentage of the etching depth Md. The straight line indicated by the dotted line in FIG. 5 shows the following relational expression.

$$y = -1.32 \times \left(\frac{x}{t}\right) + 42.87 \quad (\%) \qquad \text{Equation 2}$$

Figure 6:
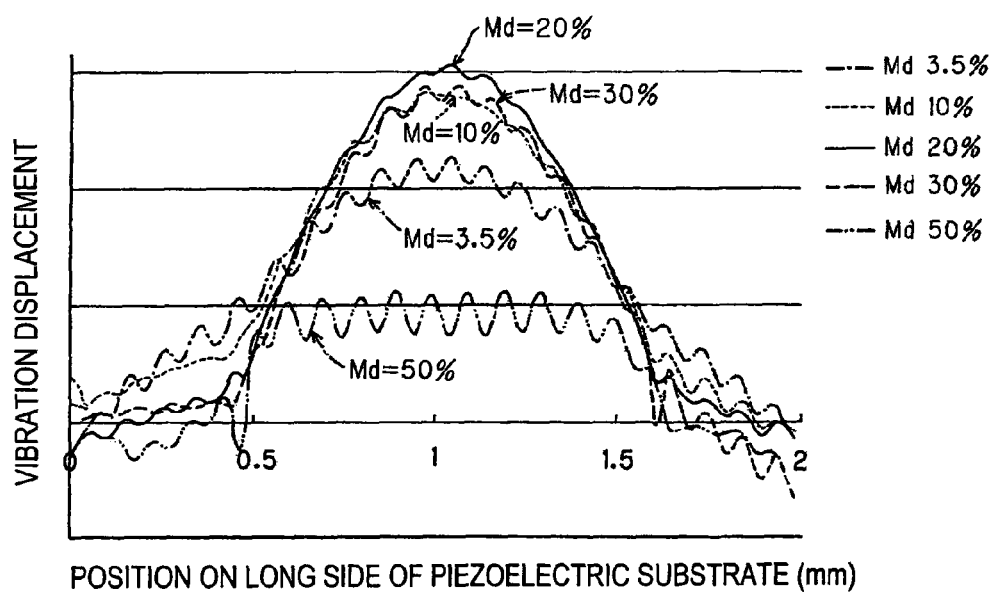
FIG. 6 is a graph showing the vibration displacement when the etching depth of a mesa-shaped piezoelectric resonator element having a fineness ratio of 25 is changed.

Next, in order to prove the relational expression shown in Equation 1, the inventors and the like have studied the changes in the vibrational mode when the etching depth Md is changed between 3.5% and 50%, based on the board thickness t, when forming the piezoelectric substrate having a fineness ratio x/t of 25 into a mesa shape. The result thereof is shown in FIG. 6.

When Md_min is calculated by assigning the fineness ratio x/t value 25 in Equation 1, values 5% to 15% are obtained. When the fineness ratio x/t value 25 is assigned in Equation 2, the value 9.78% is obtained. Therefore, in FIG. 6, when Md is 3.5%, the etching depth Md is slightly insufficient. When Md is between about 10% and 20%, the vibrational energy can be confined to the resonator section, indicating relatively favorable vibration characteristics. However, when the etching depth Md exceeds 30%, the flexural mode occurs in the resonator section. The flexural mode couples with the thickness-sliding mode that is the main mode, and the vibration characteristics become significantly poor.

From the above, the CI value of the piezoelectric element may be reduced by setting the etching depth Md based on Equation 1. The minimum value Md_min of the etching depth calculated using Equation 1 is the minimum value of the etching depth at which the characteristic change of the CI value become flat. Therefore, the degradation of the vibration characteristics accompanying the increase in the etching depth and the variations in shape caused by undesired etching may be reduced. Md_min is the minimum value of the etching depth at which the characteristic change of the CI value becomes flat. Therefore, the processing time for etching can be shortened and productivity can be increased by setting the etching value based on Md_min. Manufactured products of which the quality tends to be polarized in association with the increase in etching depth may be averaged as non-defective products, thereby contributing to improved yield. Md_min is the minimum value of the etching depth at which the characteristic change of the CI value become flat. Therefore, a piezoelectric resonator element having low instances of coupling with unnecessary modes and a high design margin may be achieved.

As can be understood from FIG. 5, when the fineness ratio x/t exceeds 30, the value of Md_min becomes significantly small, eliminating the need to form the piezoelectric resonator element into a mesa shape. Therefore, when manufacturing a piezoelectric resonator element such as that described above, it is preferable to use a piezoelectric substrate having a fineness ratio that is 30 or below. As a result, the piezoelectric resonator element as a manufactured product can achieve effects proportional to the time and number of procedures spent on manufacture.

As can be understood from FIG. 6, when the etching depth Md exceeds 30%, the effect of suppressing unnecessary modes, such as that described above, may not be achieved. Therefore, the etching depth Md is preferably 30% or below.

The data introduced in FIG. 3 to FIG. 6 as data for proving the invention is that of experiments and simulations using crystal as the piezoelectric substrate material. Although this is not particularly indicated in the descriptions, the invention is thought to be applicable to cases in which piezoelectric material other than crystal is used as the piezoelectric substrate. However, it is preferable to use crystal as the piezoelectric substrate material from the perspective of piezoelectric substrate processing, namely facilitation of mesa processing.

What is claimed is:

1. A resonator element, comprising:
    a resonator section having a thicker thickness than a peripheral section on the board surface of a substrate formed in a rectangular shape, wherein the resonator section resonates with thickness shear vibration,
    when the length of the long side of the substrate is x and the board thickness of the resonator section is t, y being set to fulfill a relationship in the following equation, based on the board thickness t, $$y = -1.32 \times \left(\frac{x}{t}\right) + 43 \pm 5 \quad (\%),$$

y being the percentage value of a difference between the board thickness t and the thickness of the peripheral section over the board thickness t, and
    a level-difference being between the resonator section and the peripheral section, and the resonator section and the peripheral section being connected by a level-difference surface, wherein the level-difference surface is positioned at a maximum amplitude of a flexural mode occurring along a displacement direction of the thickness shear vibration in the substrate.

2. The resonator element according to claim 1, wherein $$y = -1.32 \times \left(\frac{x}{t}\right) + 43 \pm 1.8 (\%).$$

3. The resonator element according to claim 1, wherein $x/t \leq 30$.
4. The resonator element according to claim 1, wherein $x/t \leq 19.8$.
5. The resonator element according to claim 1, wherein the level-difference surface has one level.
6. The resonator element according to claim 3, wherein the level-difference surface has one level.
7. The resonator element according to claim 4, wherein the level-difference surface has one level.
8. The resonator element according to claim 2, wherein $x/t \leq 30$.
9. The resonator element according to claim 2, wherein $x/t \leq 19.8$.
10. The resonator element according to claim 2, wherein the level-difference surface has one level.
11. The resonator element according to claim 8, wherein the level-difference surface has one level.
12. The resonator element according to claim 9, wherein the level-difference surface has one level.

* * * * *